(12) United States Patent
Keller et al.

(10) Patent No.: US 6,487,709 B1
(45) Date of Patent: Nov. 26, 2002

(54) RUN-TIME ROUTING FOR PROGRAMMABLE LOGIC DEVICES

(75) Inventors: Eric R. Keller, Boulder, CO (US);
Steven A. Guccione, Austin, TX (US);
Delon Levi, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/501,356

(22) Filed: Feb. 9, 2000

(51) Int. Cl.[7] .................................................. G06F 17/50
(52) U.S. Cl. ............................................ 716/14; 716/16
(58) Field of Search ............................... 716/12, 16, 17

(56) References Cited

U.S. PATENT DOCUMENTS

| | | | | |
|---|---|---|---|---|
| 5,737,580 A | * | 4/1998 | Hathaway et al. ............. | 716/12 |
| 5,946,478 A | * | 8/1999 | Lawman ....................... | 716/16 |
| 6,078,736 A | * | 6/2000 | Guccione ...................... | 716/16 |
| 6,112,020 A | * | 8/2000 | Wright ......................... | 716/17 |
| 6,216,259 B1 | * | 4/2001 | Guccione et al. ............. | 716/17 |
| 6,311,316 B1 | * | 10/2001 | Huggins et al. .............. | 326/37 |

* cited by examiner

Primary Examiner—John F. Niebling
Assistant Examiner—Stacy A Whitmore
(74) Attorney, Agent, or Firm—LeRoy D. Maunu; Edel M. Young

(57) ABSTRACT

A system and method for configuring routing resources of a programmable logic device are presented in various embodiments. In one embodiment, a first function is provided that automatically generates configuration bits for configuration of routing resources to connect a source to a sink. The input parameters to the to the first function include the source and the sink. A second function is provided to automatically generate configuration bits for configuration of routing resources that connect a source to a plurality of sinks. The second function is responsive to input parameters specifying the source and plurality of sinks. Additional program interfaces are provided and each provides various controls over the routing process.

23 Claims, 10 Drawing Sheets

Figure 9:
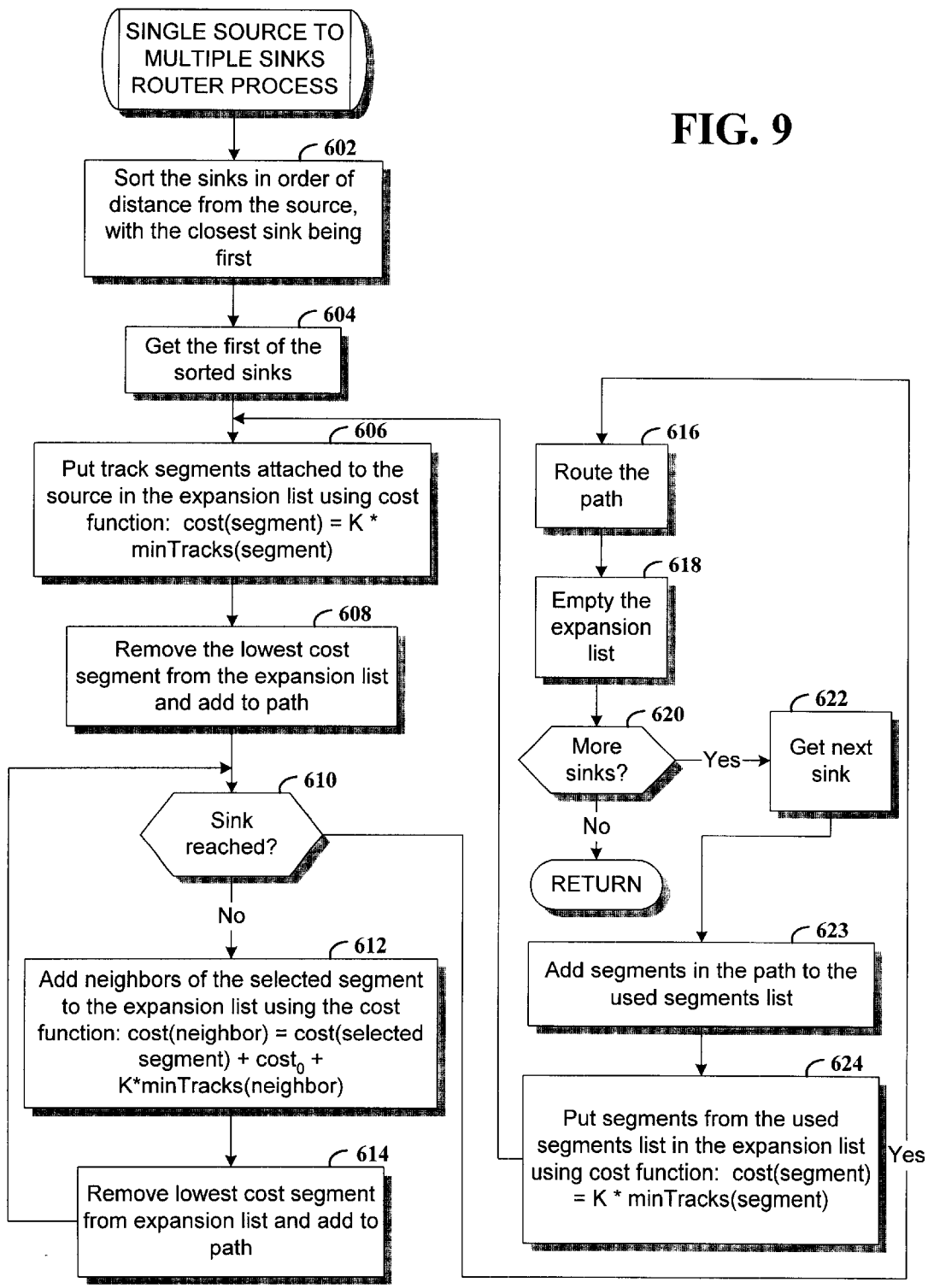

RUN-TIME ROUTING FOR PROGRAMMABLE LOGIC DEVICES

RELATED PATENT APPLICATIONS

This patent application is related to the following co-pending patent applications:

1. U.S. patent application Ser. No. 08/919,531, entitled, "METHOD OF DESIGNING FPGAS FOR DYNAMICALLY RECONFIGURABLE COMPUTING," filed on Aug. 28, 1997 by Steven A. Guccione; and 2. U.S. patent application Ser. No. 09/168,300, entitled "CONFIGURATION OF PROGRAMMABLE LOGIC DEVICES WITH ROUTING CORES", filed Oct. 7, 1998 by Steven Guccione and Delon Levi.

The contents of the above applications are incorporated herein by reference.

GOVERNMENT CONTRACT

The U.S. Government has a paid-up license in the above referenced invention and the right in limited circumstances to require the patent owner to license others on reasonable terms as provided for by the terms of DABT63-99-3-0004 awarded by DARPA.

FIELD OF THE INVENTION

The present invention generally relates to configuration of programmable logic devices, and more particularly to run-time configuration of routing resources.

BACKGROUND

Field programmable gate arrays (FPGAs), first introduced by XILINX in 1985, are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability.

The field of reconfigurable computing has advanced steadily for the past decade, using FPGAs as the basis for high-performance reconfigurable systems. Run-Time Reconfigurable (RTR) systems distinguish themselves by performing circuit logic and routing customization at run-time. RTR systems using FPGAs are expected to result in systems that require less hardware, less software, and fewer input/output resources than traditional FPGA-based systems. However, scarcity of software that supports RTR is believed to be one reason that RTR has been outpaced by research in other areas of reconfigurable computing.

Whereas with traditional configuration of FPGAs the time taken to generate a programming bitstream is generally not real-time critical, with RTR systems, the time required to generate the programming bitstream may be critical from the viewpoint of a user who is waiting for the FPGA to be reconfigured. Thus, it may be acceptable to take hours to generate a programming bitstream using traditional configuration methods. In a runtime environment, however, it is expected that the reconfiguration process require no more than a few seconds or even a fraction of a second.

Reconfiguration of a FPGA may include routing and rerouting connections between the logic sections. Routers in a traditional configuration process generally route connections for all the circuit elements. That is, these routers define connections for all the circuit elements in a design, expending a great deal of time in the process. In an RTR environment, traditional routing methods are inappropriate given the real-time operating constraints. Present run-time routing methods provide a great deal of program control over the routing process. For example, the JBits program from Xilinx allows a program to manipulate individual bits in the configuration bitstream for configuring routing resources. While this approach provides a great deal of flexibility, the drawback is added program complexity.

A system and method that addresses the aforementioned problems, as well as other related problems, is therefore desirable.

SUMMARY OF THE INVENTION

A system and method for configuring routing resources of a programmable logic device are presented in various embodiments. In one embodiment, a first application programming interface is provided which automatically generates configuration bits for configuration of routing resources to connect a source to a sink. The input parameters to the to the first interface include the source and the sink. A second programming interface is provided to automatically generate configuration bits for configuration of routing resources that connect a source to a plurality of sinks. The second interface is responsive to input parameters specifying the source and plurality of sinks. Additional program interfaces are provided to allow greater control over the routing process.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 1 is a flow chart illustrating the design of a circuit implemented in an FPGA using a reconfigurable logic coprocessor;

FIG. 2 is a block diagram of a system 200 for configuration of a programmable logic device 202, according to one embodiment of the invention;

FIG. 3 is a flowchart of a process for initial configuration and run-time reconfiguration of a programmable logic device;

FIG. 4 is a functional block diagram that illustrates various configurable routing resources of a programmable logic device;

FIG. 5 is a block diagram illustrating a partial row of configurable logic blocks (CLBs) and general routing matrices (GRMS) for an FPGA;

FIG. 6 is a block diagram illustrating routing from a source to a sink in the context of CLBs and GRMs of an FPGA;

FIG. 7 is a flowchart of a process for routing from a single source to a single sink in accordance with one embodiment of the invention;

FIGS. 8A–8F to illustrate 12 templates generated for an input source and sink;

FIG. 9 is a flowchart of a process for routing from a single source to multiple sinks in accordance with one embodiment of the invention;

FIGS. 10A–10D illustrate, in sequence, the construction of a path in routing from a single source to multiple sinks using the process of FIG. 9 for a first example including a source and multiple sinks; and FIGS. 11A–11D illustrate, in sequence, the construction of a path in routing from a single source to multiple sinks according to a second example.

DETAILED DESCRIPTION

Figure 1:
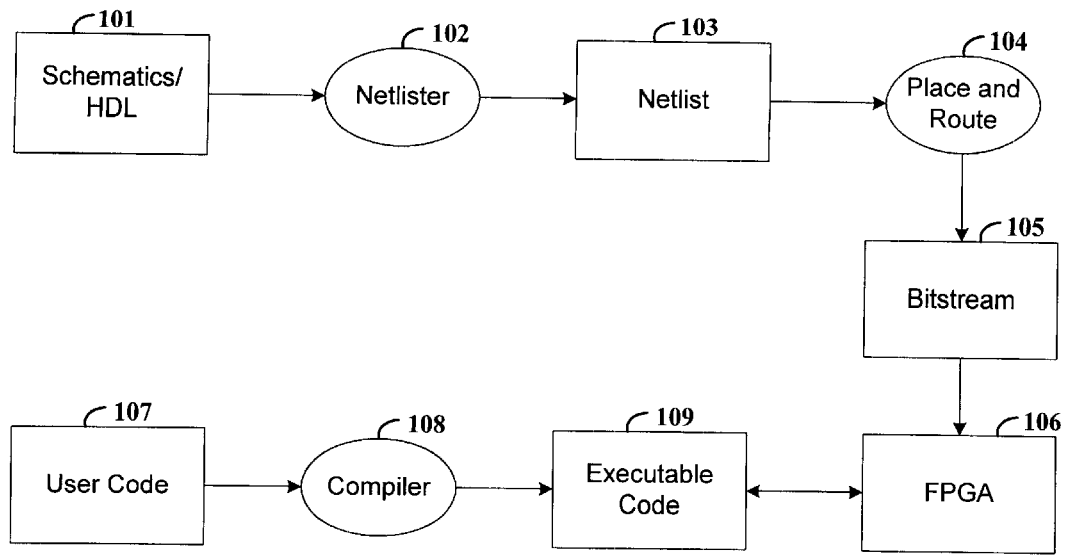

Design of a circuit implemented in an FPGA using a reconfigurable logic coprocessor currently requires a combination of two distinct design paths, as shown in FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a net list 103 for the design, importing this netlist into an FPGA placement and routing tool 104, which finally generates a bitstream file 105 of configuration data used to configure the FPGA 106.

Once the configuration data has been produced, the next task is to provide software to interface the processor to the FPGA. The user enters user code 107 describing the user interface instructions, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult and error-prone.

In addition to the problems of interfacing the hardware and software in this environment, there is also the problem of design cycle time. Any change to the circuit design requires a complete pass through the hardware design tool chain (101–106 in FIG. 1). This process time is time consuming, with the place and route portion of the chain typically taking several hours to complete.

Finally, this approach provides no support for run-time reconfiguration. The traditional hardware design tools provide support almost exclusively for static design. It is difficult to imagine constructs to support run-time reconfiguration in environments based on schematic or HDL design entry.

Figure 2:
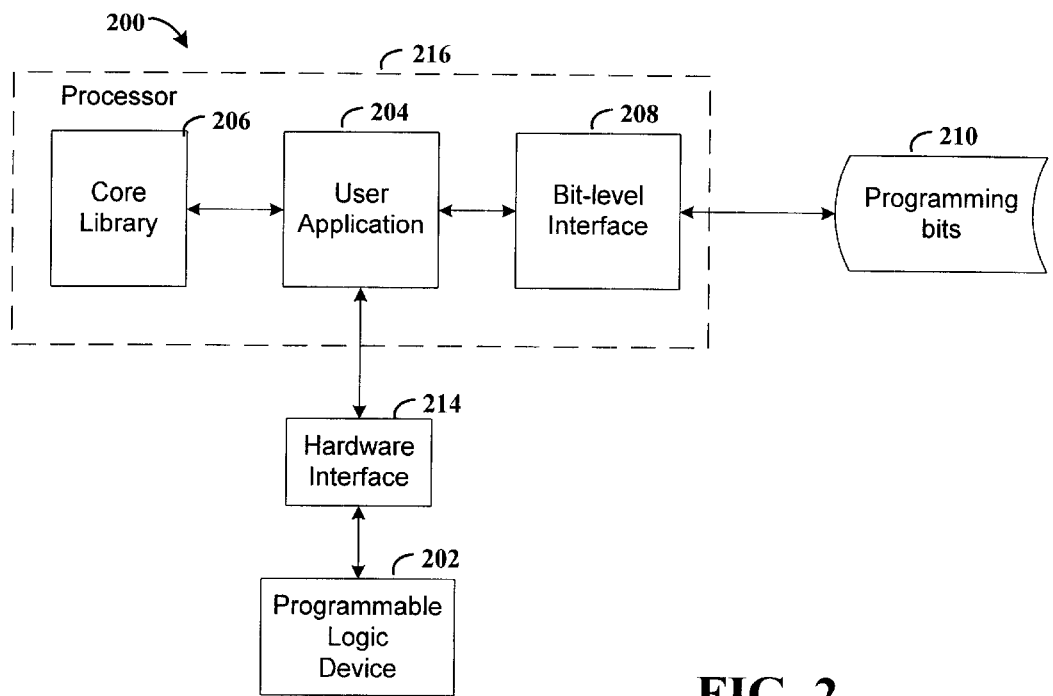

FIG. 2 is a block diagram of a system 200 for configuration of a programmable logic device 202, according to one embodiment of the invention. It will be appreciated that system 200 also supports run-time reconfiguration of the programmable logic device 202.

System 200 includes a user application program 204 that is written in the Java® language, for example. The application program 204 may be written to perform various functions relative to the environment in which system 200 is used. For example, in addition to configuration and/or run-time reconfiguration of programmable logic device 202, the user application program 204 may be programmed to provide user-interface functions and/or digital signal processing.

Core library 206 is a collection of macrocell or "core" generators that are implemented as Java classes. The cores are generally parameterizable and relocatable within a device. Examples of cores include counters, adders, multipliers, constant adders, constant multipliers, flip-flops and other standard logic and computation functions.

Bit-level interface 208 includes an application program interface that allows the user application program 204 to manipulate configurable resources of programmable logic device 202. The bit-level interface also includes a set of functions, one or more of which are invoked when the user application program 204 references the application program interface. The set of functions in the bit-level interface manipulate selected ones of programming bits 210, based on the type of programmable logic device. For example, some of the functions in the set may be programmed for certain devices in the XC4000EX family of FPGAs from XILINX, and others of the functions may programmed for other devices in the XC4000XL family. Bit-level interface software is generally understood by those skilled in the art. For example, bit-level interface software has been provided with the XC6200 series FPGA from XILINX.

The programming bits are stored in storage element 212. Storage element 212 may be magnetic, optical, electronic, or a suitable combination thereof that is readable and writable.

While core library 206, user application 204, and bit-level interface 208 are written in Java in the example embodiment, it will be appreciated that many other languages would also be suitable.

Hardware interface 214 includes a portable layer of software and accompanying hardware to couple application program 204 to programmable logic device 202. For example, hardware interface 214 may be the Xilinx Hardware Interface (XHWIF) which is available from XILINX.

Processor 216 is coupled to programmable logic device 202 via hardware interface 214. The functional requirements of system 200 dictate the particular style and capabilities of processor 216. For example, some applications may call for a RISC based processor while others may call for a CISC. Various ones of special purpose or general purpose processors from manufacturers such as Intel, Sun Microsystems, Motorola, IBM, AMD and others may be suitable.

Figure 3:
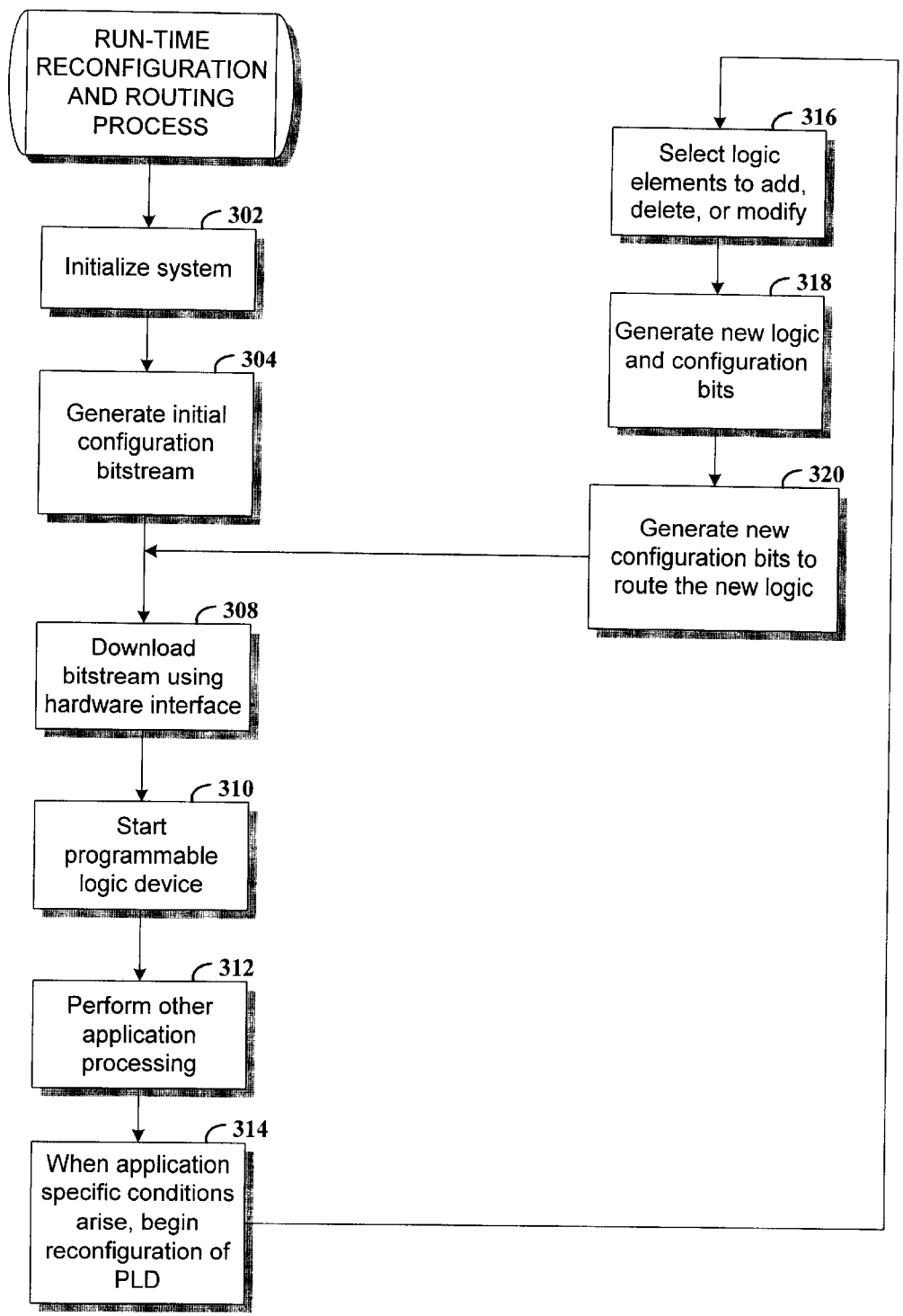

FIG. 3 is a flowchart of a process for initial configuration and run-time reconfiguration of a programmable logic device according to an one embodiment of the invention. In accordance with an example embodiment of the invention, the process can be implemented as an application program, for example, user application program 204 of FIG. 2. The example process proceeds in two phases. In the first phase, the programmable logic device is initially configured, and in the second phase, the device is dynamically reconfigured in accordance with application processing requirements.

At step 302 various components in the example system, aside from the programmable logic device, are initialized. The process then proceeds with configuration of the programmable logic device. At step 304, an initial configuration bitstream is generated. For example, the bitstream can be generated using a core library to generate core logic along with routing configuration. Based on the generated logic cores and router cores, the bit-level configuration bitstream is generated to configure the programmable logic device 202. The initial configuration bitstream is downloaded to the programmable logic device 202 at step 308, and the programmable logic device is made an operational component of the example system 200 at step 310.

Step 312 begins the run-time phase of processing by application program 204. Application program 204 includes code to monitor various application conditions, as illustrated at step 314. An example application provides adaptive digital filtering, which depends on various real-time system conditions. Run-time reconfiguration may also be initiated by, for example, user command line inputs, user GUI inputs, and the state of programmable logic device 202.

At step 316, application program 204 selects the logic elements, which define the circuit implemented by the programmable logic device, to be modified based on the information from step 314. New logic and configuration bits are generated at step 318, for example, using techniques described in the co-pending patent applications. At step 320, new configuration bits are generated to route the new logic using the application programming interface and associated techniques described herein. Processing then proceeds to step 308.

It will be appreciated that downloading the bitstream as set forth in step 308 can involve either a partial reconfiguration or full reconfiguration of the programmable logic device 202. For example, the XC4000 series FPGAs from XILINX support only full reconfiguration, whereas the Virtex FPGA, also from XILINX, supports partial reconfiguration. Thus, usage of the term "bitstream" is intended to encompass sequences of programming bits for both partial and full reconfiguration.

Figure 4:
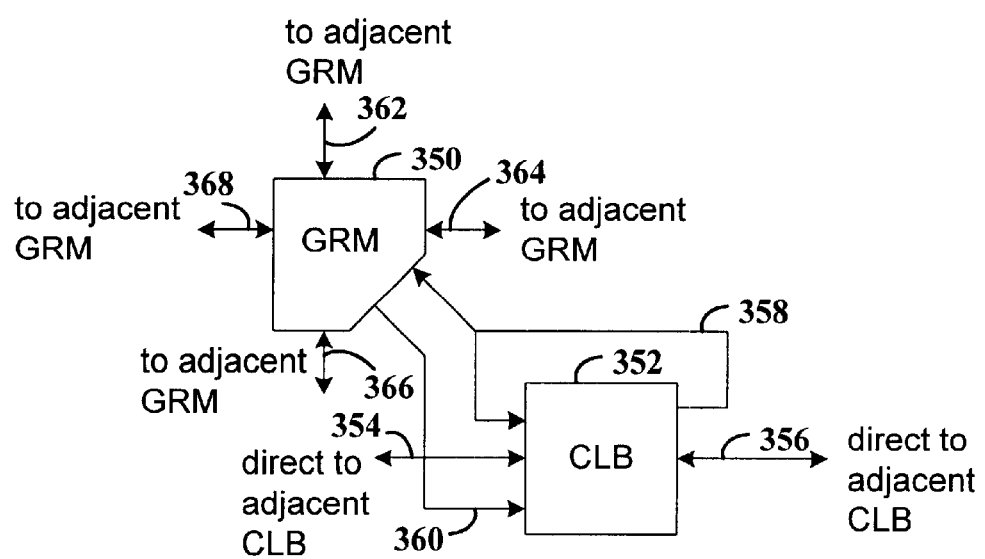

FIG. 4 is a functional block diagram that illustrates various configurable routing resources of a programmable logic device, for example, the Virtex FPGA from Xilinx. A single paired general routing matrix (GRM) 350 and configurable logic block (CLB) 352 are illustrated. The actual device is comprised of a plurality of such pairs in a matrix arrangement.

Each CLB includes configurable direct connections to horizontally adjacent CLBs, as shown by lines 354 and 356. For example, the Virtex FPGA allows output ports YB, Y, YQ, XB, X, and XQ to be connected to input ports G1–G4, BY, BX, and F1–F4 of a horizontally adjacent CLB. Output ports from CLB 352 can be configured to connect to GRM 350 via signal line 358. Selected output ports can also be configured to connect to feedback to input ports of the CLB. Signal lines of GRM 350 can be configured to connect to the input ports of CLB 352, as shown by line 360.

GRM 350 is a switch matrix through which horizontal and vertical routing resources connect, and is also the means by which CLB 352 gains access to the general purpose routing. The general purpose routing resources of GRM 350 include single-length lines ("single lines"), hex-length lines ("hex lines"), and long lines. Lines 362, 364, 366, and 368 represent the collection of single, hex, and long lines to adjacent GRMs in the four directions (north, south, east, and west), respectively.

There are 24 single lines to adjacent GRMs in each of the directions for a total of 96 single lines. A single line is referenced herein by direction, for example, NORTH. Ninety-six buffered hex lines route signals to GRMs that are six blocks away in each of the four directions. Organized in a staggered pattern, hex lines may be driven only at their endpoints, but can be accessed either at an endpoint or a midpoint tap. One third of the hex lines are bi-directional, and the remaining hex lines are uni-directional. A hex line is referenced herein as Direction6, for example, EAST6. Long lines are buffered and bi-directional wires that distribute signals across the device. There are 12 vertical long lines per column that span the entire device from north to south, and 12 horizontal long lines per row that span the device from west to east. CLBs have access to long lines every 6 rows/columns in a staggered pattern. Thus, each CLB has access to two horizontal long lines and 2 vertical long lines in the associated GRM.

"Wire" is used herein to refer to any routing resource, including CLB inputs, CLB outputs, output multiplexers (muxes), long lines, hex lines, single lines, and Tbufs in the context of a Virtex FPGA. Those skilled in the art will recognize comparable resources for other programmable logic devices.

Figure 5:
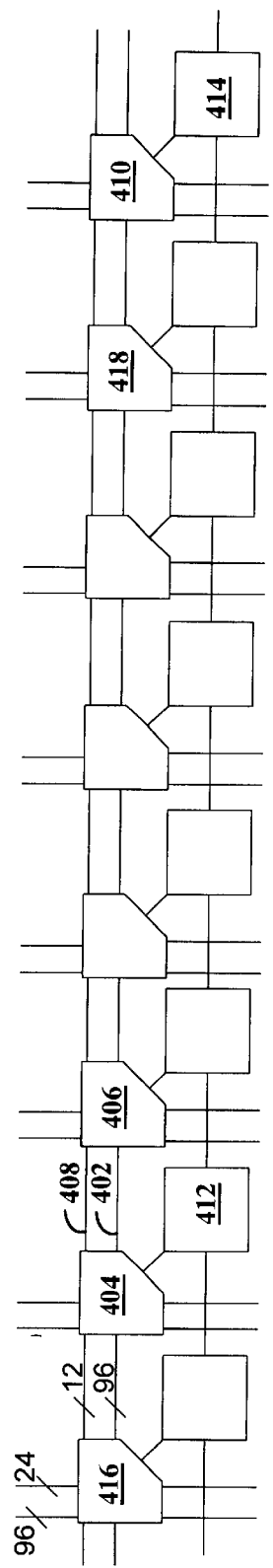

FIG. 5 is a block diagram illustrating a partial row of CLBs and GRMs for an FPGA. A set of single lines and hex lines are shown connecting the GRMS. It will be appreciated that additional routing resources are available for configuration, such as long lines, even though the resources are not illustrated. Line 402, for example, represents the east single lines that terminate in GRMs 404 and 406, and line 408 represents the east hex lines that terminate in GRM 404. It will be appreciated that a set of hex lines 408 connect GRM 404 to GRM 410, which is 6 GRMs away. Thus, CLB 412 can be connected to CLB 414 via a single hex line. Similarly, GRM 416 connects to GRM 418 via a set of hex lines.

Within each GRM, the single lines, hex lines, and long lines can be selectively connected to in order to interconnect input and output ports of selected CLBS. CLB outputs can drive any length line, long lines can drive hex lines only, hex lines can drive other hex lines and single lines, and single lines can drive CLB input ports, vertical long lines, and other single lines. The connections between the lines are made by turning on selected bits in the configuration bitstream and loading the configuration bitstream into the programmable logic device while the device is enabled for configuration.

Figure 6:
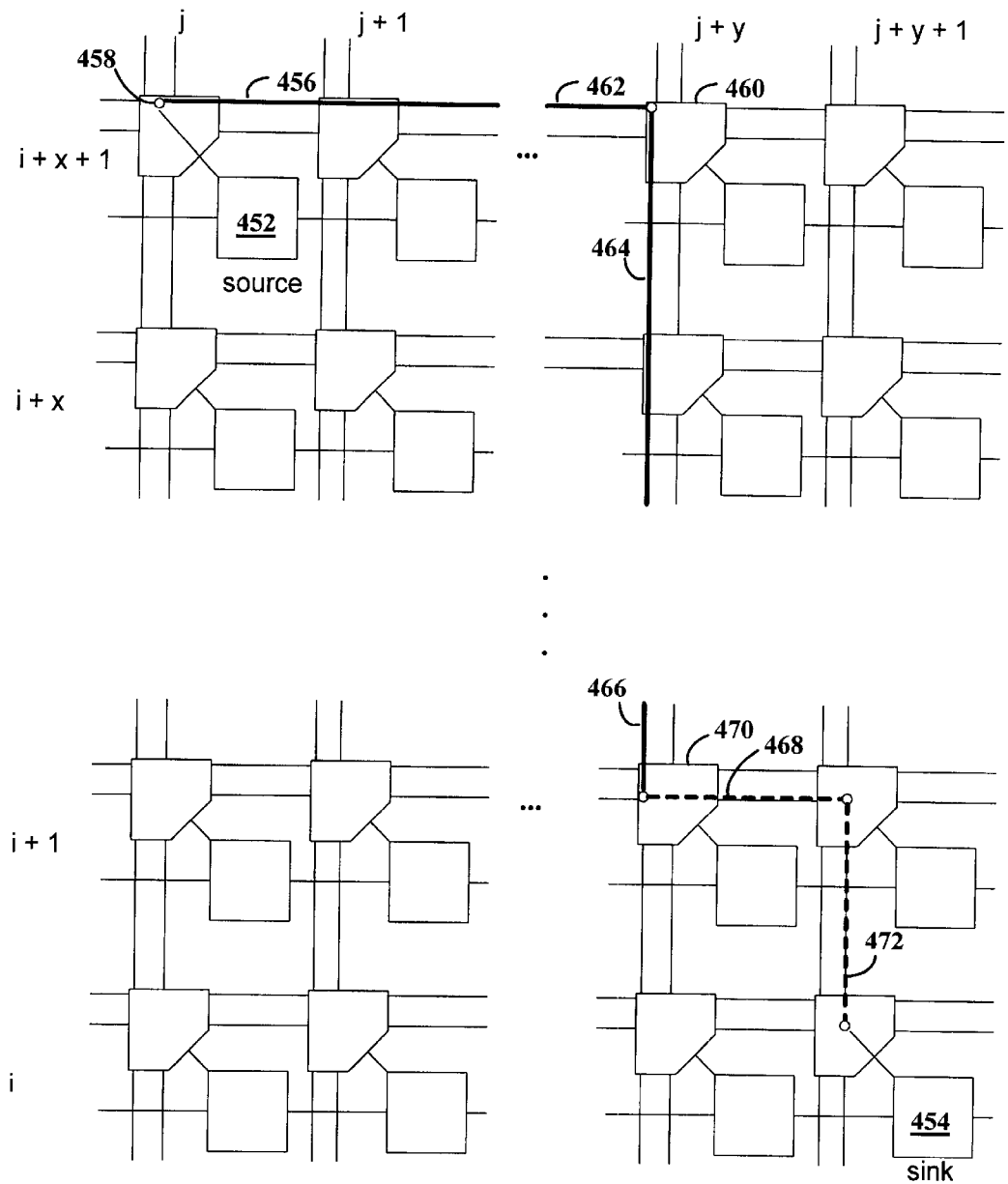

FIG. 6 is a block diagram illustrating routing from a source to a sink in the context of CLBs and GRMs of an FPGA. The solid thick lines represent hex lines used in the connection, and the dashed thick lines represent single lines. The source is one of the output ports of CLB 452, and the sink is one of the input ports of CLB 454.

In various embodiments, the present invention supports generating bits to configure routing resources via an application programming interface. The interface provides multiple levels of control over the routing task. In one embodiment, a source and a sink are provided as input data, and the route from the source to the sink is performed automatically. In another embodiment, a template is provided as input data, and the route is performed consistent with the template. Further control over the route can be exercised by specifying a path that specifically identifies the resources to use in the route.

For purposes of describing the various embodiments of the invention, the CLBs are referenced by row and column numbers, with the southernmost and westernmost CLB at row 0, column 0 (abbreviated as CLB 0,0). The CLBs of FIG. 6 are the CLBs at rows i through (i+x+1) and columns j through (j+y+1).

The task of routing from source CLB 452 to sink CLB 454 generally involves identifying the routing resources that are available and selecting a suitable path. The shortest path is generally the most desirable. In the example, a first connection is established between the specified output port of CLB 452 and hex line 456 via connection switch 458. It will be appreciated that switch 458 is configurable with a particular bit in a configuration bitstream. One or more additional hex lines are then connected in an easterly direction until GRM 460, depending on the number of columns between columns j+1 and j+y. The last EAST6 line is line 462, which is connected to the first SOUTH6 line 464. The last SOUTH6 line 466 connects to the first EAST line 468 at GRM 470. EAST line 468 connects to SOUTH line 472, which is connected to a designated input port of CLB 454.

The embodiments of the present invention support a variety of run-time routing tasks. For example, application programming interfaces are provided to route from a single source to a single sink, route from multiple sources to respective sinks, and route from a single source to multiple sinks. In addition, programming interfaces are provided to manage run-time routing, such as un-routing, checking whether a wire is configured, explicitly generating paths, and generating paths with templates.

The application programming interfaces of the present invention are implemented in an object oriented programming language in one embodiment. The primary classes include the Pin, Router, Template, and Path classes. The Pin class defines a physical end point, the Router class generally provides automated routing methods, the Template class generally provides methods for defining templates, and the Path class generally provides methods for defining paths. Before describing the application programming interfaces in detail, a process for routing from a source to a single sink is described in order to illustrate pins, paths, and templates.

Figure 7:
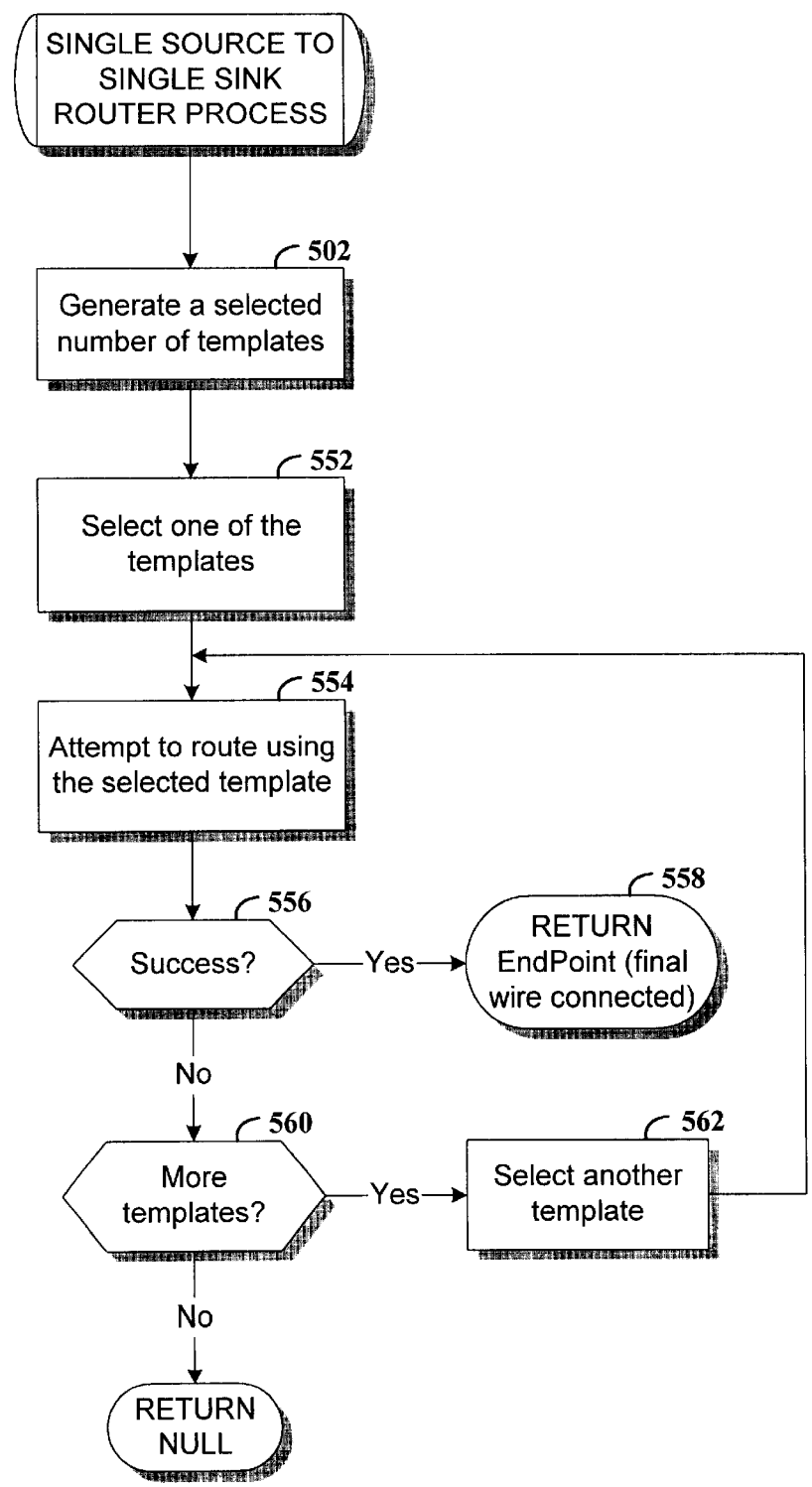

FIG. 7 is a flowchart of a process for routing from a single source to a single sink in accordance with one embodiment of the invention. The process generally entails generating a plurality of templates, attempting to route using the templates, and establishing a path consistent with a template.

At step 502, a selected number of templates are generated. Reference is made to FIGS. 8A–8F to illustrate 12 templates generated for an input source and sink. Generally, a template is an ordered set of types of routing resources to be followed in routing from a source to a sink. The set of directions are designated as resource types. The resource types include EAST, WEST, NORTH, and SOUTH for the single length lines; EAST6, WEST6, NORTH6, and SOUTH6 for the hex lines; HORIZ_LONG and VERT_LONG for the long lines; CLB_IN and CLB_OUTMUX for CLB input and output ports; HORIZM and VERTM for describing taps in the middle of horizontal and vertical hex lines; and SINGLE_FEEDBACK for connecting an output multiplexer to a single line and also connect that single line to a CLB input port.

Each of the templates illustrated in FIGS. 8A–8F is shown with source and sink end points as labeled, small circles that symbolize connection points, longer lines that symbolize one or more hex lines, and shorter lines that symbolize one or more single lines.

Figure 8A:
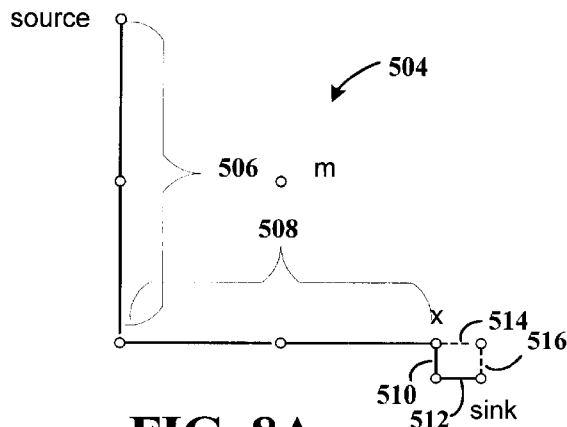

The templates are generated in a generally systematic fashion. FIG. 8A shows a first one of the templates. Template 504 is generated by first including a number of hex lines in a vertical direction from the source toward to the sink followed by a number of hex lines in a horizontal direction. Note that "vertical" and "horizontal" refer to row and column displacement, respectively. The number of vertical and horizontal hex lines depends on the number of rows and columns that separate the source and the sink. The set of vertical hex lines are designated as 506, and the set of horizontal hex lines are designated as 508. After the hex lines have been specified in the template, the single lines are added to the template. First, single lines are added to the template in the vertical direction toward the source, and then single lines are added to the template horizontally toward the source. The vertical single lines are designated as 510, and the horizontal single lines are designated as 512. It will be appreciated that the number of horizontal and vertical single lines required depends on location at which the hex lines 508 terminate relative to the sink. The template described thus far would include a sequence such as source, SOUTH6, SOUTH6, ..., EAST6, EAST6, ..., SOUTH, SOUTH, ..., EAST, EAST, ... sink.

Dashed lines 514 and 516 also illustrate single lines for an alternative template. In contrast to template 504, horizontal single lines 514 are added to the template before vertical single lines 516. Thus, FIG. 8A actually illustrates two templates, with the second template including a sequence such as source, SOUTH6, SOUTH6, ... , EAST6, EAST6, ..., EAST, EAST, ... SOUTH, SOUTH, ..., sink. The first template consisting of the solid lines, and the second template consisting of the lines from the source to connection point x, and the dashed lines from x to the sink. It will be appreciated from the foregoing that FIGS. 8A–8F illustrate 12 different templates.

Figure 8B:
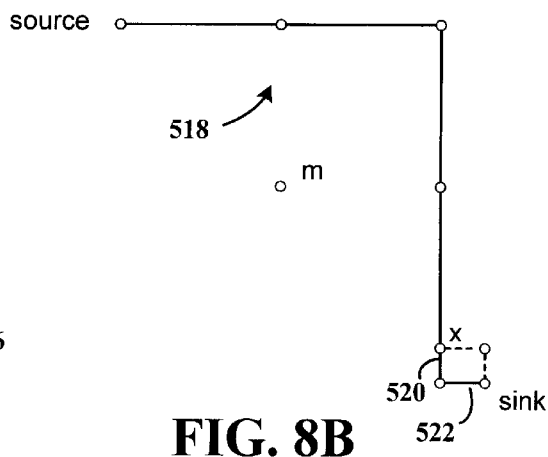

FIG. 8B illustrates template 518 in which horizontal hex lines are first added to the template followed by the vertical hex lines. Single lines 520 are added to the template first in the vertical direction followed by single lines 522 in the horizontal direction. Another template is defined with horizontal single lines added to the template before the vertical single lines.

Figure 8C:
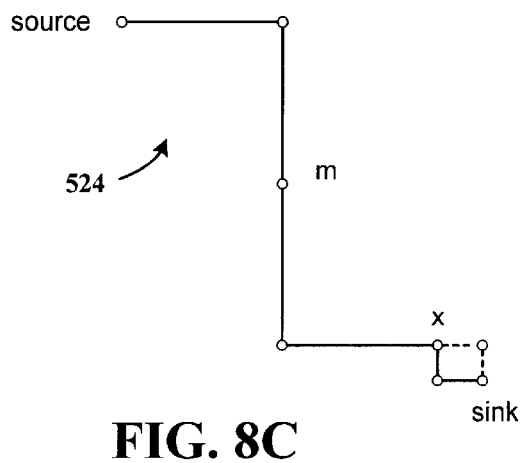

FIG. 8C illustrates a template 524 in which a midpoint m is identified, and the template is defined to include the midpoint. The first step in generating the template is adding horizontal hex lines followed by vertical hex lines between the source and the midpoint. The next step is to add vertical hex lines followed by horizontal hex lines between the midpoint and x. Two alternative templates are then defined as described above by using single lines between x and the sink.

Figure 8D:
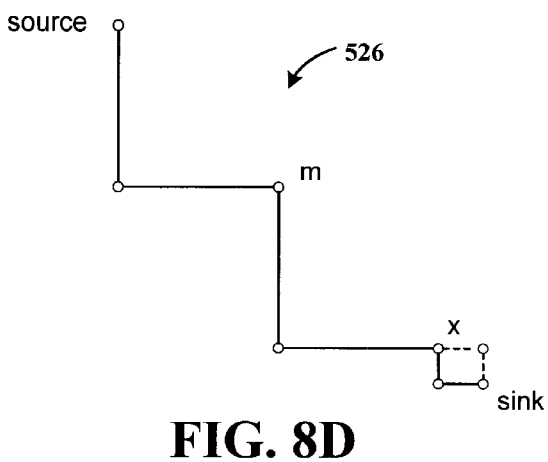
Figure 8E:
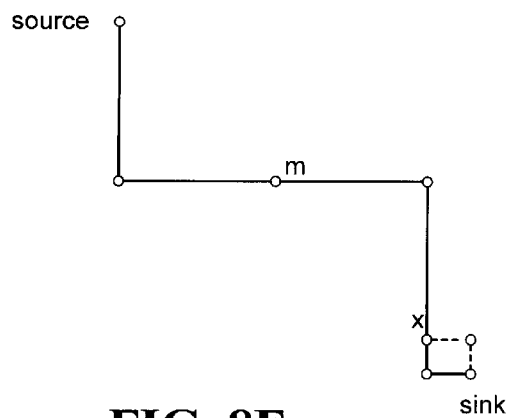
Figure 8F:
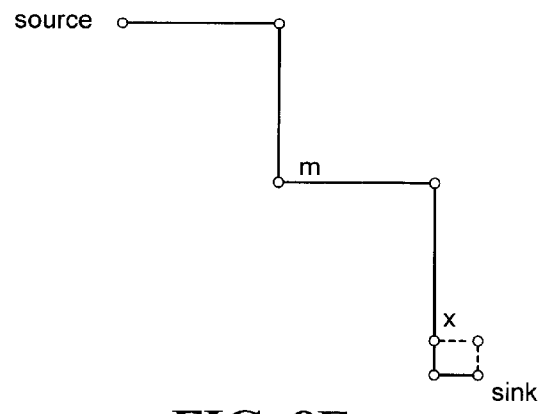

FIG. 8D illustrates a template 526 in which vertical hex lines followed by horizontal hex lines are added to the template between the source and the midpoint. From the midpoint to x, vertical hex lines are first added followed by horizontal hex lines. The single lines are added to the two different templates between x and the sink as described above. FIGS. 8E and 8F illustrate 4 additional templates, all passing through the midpoint.

Returning now to step 552 of FIG. 7, an arbitrary one of the templates is selected. At step 554, a route is attempted from the source to the sink consistent with the selected template. If there were routing resources available consistent with the template and the route was a success, decision step 556 directs processing to step 558, where the EndPoint is returned to the calling program. The EndPoint is the final wire connected in the path. If routing resources were unavailable consistent with the selected template, decision step 556 directs processing to decision step 560 to test for more templates. If there are more templates for which to attempt to route, step 562 selects another one of the templates and processing is directed to step 554. Otherwise, a null value is returned to the calling program.

Turning now to the classes that implement the application programming interfaces, an object of the class pin defines a physical endpoint consisting of a row, column, and wire.

The Class "Router"

The class router includes the following methods: route, getPath, isOn, removeConnection, unroute, and reverseunroute. The route method automatically routes from a source to a sink, as specified with input parameters. The following paragraphs describe the format and function of the application programming interfaces embodied in the different route methods.

public Connections[ ] route(int row, int col, int from, int to)

This route method routes a single connection. The configuration bitstream is updated if the route was successful.

The parameters include:
　row—the CLB row
　col—the CLB col
　from—the wire that is doing the driving
　to—the wire that is being driven
The method returns an array of connections that represents the specific connections of wires or null if no connection is made.

public Connections [ ] [ ] route(EndPoint[ ] source, EndPoint[ ] sink)
　This route method routes each of the connections from each of the sources in EndPoint[ ] source to each of the sinks in EndPoint[ ] sink. The parameters source and sinkmust be the same length.
　The method returns a double array of final connections. The array will be the same length as the input arrays and includes the final wires connected. An element will be null if the connection was not routed. The configuration bitstream is updated for routes that were successful.

public Connections[ ] route(EndPoint source, EndPoint sink)
　This route method finds a path routed from EndPoint from to EndPoint to and sets the proper bits in the configuration bitstream.
　The method returns an array of Connections and returns null if no connection is made.

public Connections[ ] route(Pin start, int end_wire, Template temp)
　This route method finds a path routed from start to end_wire using the input Template parameter, temp, and sets the proper bits in the configuration bitstream.
　The route method searches for routing resources that are consistent with the resources specified in the template, beginning at the source.
　The method returns an array of Connections.

public Connections [ ] [ ] route(EndPoint source, EndPoint[ ] sink)
　This route method routes from a single source, EndPoint from to multiple sinks, Endpoint[ ] and sets the appropriate bits in the configuration bitstream.

Format and Function
　The format and function of the application programming interfaces embodied in the methods, getPath, isOn, remove connection, unroute, and reverseunroute, are described in the following paragraphs.

public Path getpath(int row, int col, int start, Template temp)
　This getPath method finds a path given an input template parameter. No end wire is specified. In this case, the router will find the right type of resource and return the particular instances of the resources that were used. The parameters include:
　row—the CLB starting row
　col—the CLB starting column
　start—the starting wire
　temp—the template to follow to get from the start to end public Path getpath(int row, int col, int start, int end, Template temp)
　This getpath method finds a path given an end wire input parameter, end, and an input template parameter. The parameters include:
　row—the CLB starting row
　col—the CLB starting col
　start—the starting wire
　end—the ending wire
　temp—the template to follow to get from the start to end public boolean isOn(int row, int col, int wire)
　This method checks whether the specified wire is on as indicated in the configuration bitstream.

public Connections [ ] remove connection(int row, int col, int from, int to)
　This method removes the specified connection by clearing the specified bit in the configuration bitstream. The parameters include:
　row—the CLB row
　col—the CLB col
　from—the wire that is doing the driving.
　to—the wire that is being driven.

public Connections [ ] unroute(EndPoint start)
　This method turns off connections and releases the resources of a circuit beginning at the EndPoint start. All connections of paths to all sinks are removed by clearing the appropriate bits in the configuration bitstream.

public Connections [ ] reverseUnroute(EndPoint start)
　This method turns off connections and releases the resources of a circuit starting from the EndPoint start and working backwards. All connections are removed up to the point where a wire is one of several wires being driven.

The Class "Path"
　An object of the class path includes a row and a column that are represented with respective integers, along with an array of integers that sets forth the path. A path indicates specific resources to be used to connect a source and sink (as compared to a template which indicates directions and types of resources to be used in a connection). The format and function of the application programming interfaces embodied in methods addpath, addStart, and addwire are described in the following paragraphs.

public void addPath(int row, int col, int[ ] path_arr)
　This method can be used to connect to a line without tapping the line at its end point. For example, if a path already includes S0_XQ to Out[0] to VertLong[0], addPath could be used to connect VertLong[0] at CLB row+12,col (which is the same long vertical wire as presently in the path but in a different row) to HexWest[0] to SingleWest[0] to S0F1. This path includes two path segments comprising a single path. The method is an alternative to the addstart and addwire methods described below.

public void addWire(int wire)
　This method adds a wire to the current path.

public void addStart(int row, int col, int wire)
　This method adds a starting point to the current path. This is used in cases where the tap point is not implicit in the wire, such as a long line or if a hex line is to be tapped at the midpoint. The parameters include:
　row—the starting CLB row
　col—the starting CLB col
　wire—the starting wire The Class "Template"
　An object of the class template includes a set of directions to be used by the route method in establishing connections from a source to a sink. Templates specify types of resources, not actual resources, thereby allowing the routing process to determine if there are resources available of the type and direction specified in the template. The format and function of the application programming interfaces embodied in the methods, adddirection and addTapLocation, are described in the following paragraphs.

public void addDirection(int dir)

This method adds a direction to the template. If the direction is a long line or a hex line to be used for midtap, the row and col offset must be defined.

public void addTapLocation(int row, int col)

This method defines the tap offset for Midtap hexes and longs

EXAMPLES

Example code that uses the preceding the methods is provided following the descriptions for FIGS. 9, 10A–10D, and 11A–11D.

FIG. 9 is a flowchart of a process for routing from a single source to multiple sinks in accordance with one embodiment of the invention. The process attempts to construct the shortest paths that are feasible in routing from the source to the multiple sinks, while minimizing the routing resources used in the paths.

The process begins at step 602 where the sinks are sorted in the order of respective distances from the source, with the closest sink being the first in the order. The distance is measured in numbers of rows and columns separating the source and sink. For example, the distance separating CLB 10,10 and CLB 15,15 is 10 (5 columns+5 rows).

At step 604, the first of the sorted sinks is considered. At step 606, an expansion list is constructed. The expansion list is a list of segments that is ordered by cost, where the cost(segment)=K*minTracks(segment). K is a predetermined constant, and minTracks(segment) is the minimum number of resources needed to route from the sink to the segment. A segment is generally either a single wire or a collection of connected wires. The segments added to the expansion list at step 606 are the "track segments." Track segments are any wires that the source drives directly. For example, the track segments for a CLB include the hex lines and single lines that the CLB can drive from its output multiplexers.

At step 608, the lowest cost segment is removed from the expansion list, and step 610 begins a process loop to construct a path from the segment to the selected sink. Decision step 610 tests whether the sink in process can be reached from the selected segment. If not, processing proceeds to step 612. At step 612, the segments to which the selected segment can connect ("neighbors") are added to the expansion list using second cost function, where cost (neighbor)=cost(segment)+cost$_0$+K*minTracks(neighbor). Cost$_0$ is a cost value that is associated with a type of wire. For example, long lines have a cost value 500 to avoid usage thereof, hex lines and single lines have cost values 1, and direct connections have a cost value 0.

At step 614, the lowest cost segment is removed from the expansion list and added to the path under construction. For an example route in which two segments have been thus far added to the path, the path may include HexEast[0], HexEast [20], which represents two particular east hex lines. Processing returns to decision step 610 from step 614 and the loop is repeated until the sink is reached. Note that at step 612, the segment that was most recently removed from the expansion list is the segment from which the neighboring segments are determined.

When the sink is reached, decision step 610 directs processing to step 616 where the path is routed. That is, the appropriate bits are set in the configuration bitstream.

At step 620, the expansion list is cleared, and decision step 620 tests whether there are more sinks to which routing is required. If so, processing proceeds to step 622 to get the next sink. At step 623, the segments in the path are added to the list of used segments, and at step 624, the segments from the used segments list are put in the expansion list using the cost function described above for the new sink in process. Processing proceeds to step 606, where track segments are added to the expansion list.

FIGS. 10A–10D illustrate, in sequence, the construction of a path in routing from a single source to multiple sinks using the process of FIG. 9, according to a first example. A second example is illustrated in FIGS. 11A–11D. The source is marked with an "X", and the sinks are empty boxes. The examples are not intended as a detailed illustration of the step-by-step construction of the path using the process of FIG. 9. Instead, the figures are intended to generally illustrate the reuse of segments in routing from a source to multiple sinks.

Figure 10A:
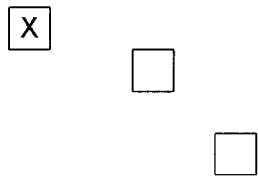
Figure 10B:
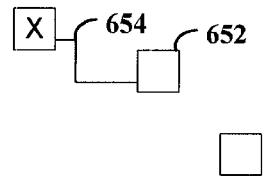

FIG. 10A shows the initial state in which no wires have been added to the path. In FIG. 10B, the source has been routed to sink 652 via path 654. Path 654 is comprised of a sequence of long, hex, and single lines, as needed to connect the source to sink 652. Note that the relative lengths of the lines that form the path are not indicative of the types of lines.

Figure 10C:
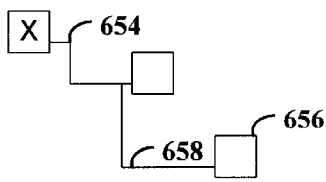

In FIG. 10C, the source is routed to sink 656. Note that the path from the source to sink 656 reuses portions of the path from the source to sink 654. Segment 658 extends from path 654 to connect to sink 656.

Figure 10D:
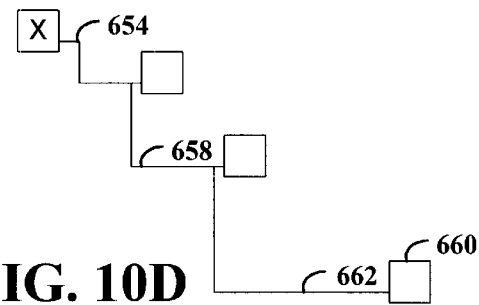

A path is constructed to sink 660 in FIG. 10D. Portions of paths 654 and 658 are reused in constructing the path to sink 660. Segment 662 connects sink 660 to segment 658.

Figure 11A:
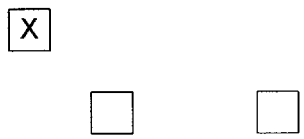
Figure 11B:
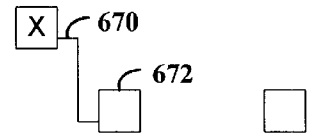

FIGS. 11A–11D illustrate, in sequence, the construction of a path in routing from a single source to multiple sinks according to a second example. FIG. 11A shows the relative locations of the source and sinks. In FIG. 11B, path 670 has been constructed between the source and the closest sink, sink 672.

Figure 11C:
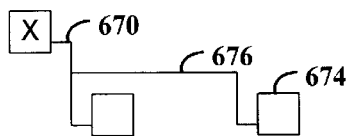
Figure 11D:
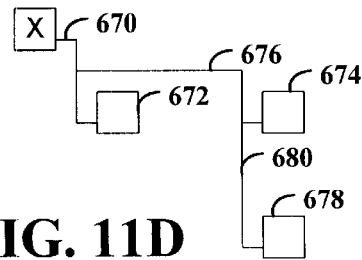

In FIG. 11C, the next closest sink, sink 674 is connected to the source. A portion of path 670 is reused and extended with segment 676 to connect sink 674. Sink 678 is farthest away from the source and is the last sink connected to the source. Some of the path from the source to sink 674 are reused and connected with segment 680 to connect to sink 678. It will be appreciated that as between path 670 (connecting the source to sink 672) and path 676 (connecting the source to sink 674), the process selected path 676 for reuse instead of path 670 since path 680 uses fewer additional resources than would a path that extends path 670.

The following snippets of sample code illustrate usage of the programming interfaces provided with the present invention. Comments are interspersed in the code to explain the functionality.

```
/* AUTO ROUTE - source to sink */
    /*   class wires has all of the wire definitions as
         constants */
    /* source - row=13, col=15, wire=S0__XQ */
    Pin source = new Pin(13,15,Wires.S0__XQ);
    /* sink - row=22, col=40, wire=S0F1 */
    Pin sink = new Pin(22,40,Wires.S0F1);
```

-continued

```
    /*    route(Pin source, Pin sink) - auto routes single
          source to single sink */
    Connections [ ] connections= jroute.route(source, sink);
/* AUTO ROUTE - source to several sinks */
    /* source - row=22, col=22, wire=S0_XQ */
    Pin source = new Pin(22,22,Wires.S0_XQ);
    /* 2 sinks */
    Pin[ ] sink = new Pin[2];
    /* sink - row=27, col=30, wire=S0F1 */
    sink[0] = new Pin(27,30,Wires.S0F1);
    /* sink - row=2, col=1, wire=S1G1 */
    sink[1] = new Pin(2,1,Wires.S1G1);
    /*    route(Pin source, Pin[ ] sink) - auto routes single
          source to several sink */
    jroute.route(source, sink);
/* AUTO ROUTE - several sources to several sinks */
    /* 2 sources */
    Pin source = new Pin[2];
    /* source - row=22, col=22, wire=S0_XQ */
    source[0] = new Pin(22,22,Wires.S0_XQ);
    /* source - row=1, col=13, wire=S1_YQ */
    source[0] = new Pin(1,13,Wires.S1_YQ);
    /* 2 sinks */
    Pin[ ] sink = new Pin[2];
    /* sink - row=27, col=30, wire=S0F1 */
    sink[0] = new Pin(27,30,Wires.S0F1);
    /* sink - row=2, col=1, wire=S1G1 */
    sink[1] = new Pin(2,1,Wires.S1G1);
    /*    route(Pin[ ] source, Pin[ ] sink) - auto routes
multiple sources to multiple sinks */
    jroute.route(source, sink);
/* Define a template - way 1 */
    Template t = new Template ( );
    try {
        t.addDirection(Wires.CLBOUTMUX);
        t.addDirection(Wires.HORIZM);
        t.addTapLocation(0,-3);
        t.addDirection(Wires.SOUTH);
        t.addDirection(Wires.CLBIN);
    }catch (TemplateException te) {
        System.exit(-1)
    }
    /*    route(int start_row, int start_col, int start_wire,
          int end_wire, Template) */
    Pin start1 = new Pin(10,10,Wires.S0_XQ);
    jroute.route(start1,Wires.S0F1,t);
    /* can use the same template for another route */
    Pin start2 = new Pin(11,11,Wires.S0_XQ);
    jroute.route(start2,Wires.S0F1,t);
/* Define a template - way 2 */
    /*    define a template that involves an outmux, a HexWest,
          a SingleSouth, and a CLB Input */
    int[ ] temp = { Wires.CLBOUTMUX, Wires.WEST6,
                    Wires.SOUTH, Wires.CLBIN };
    Template t = new Template(temp);
    /*    route(int start_row, int start_col, int start_wire,
          int end_wire, Template) */
    Pin start1 = new Pin(10,10,Wires.S0XQ);
    jroute.route(start1,Wires.S0F1,t);
    /* can use the same template for another route */
    Pin start2 = new Pin(11,11,Wires.S0_XQ);
    jroute.route(start2,Wires.S0F1,t);
/* Define a Path - way 1 */
    /*    the class Path is a way to define an array of
          resources not path based in nature */
    Path p = new Path( );
    /* Start at 10,10, S0_XQ */
    p.addStart(10,10,Wires.S0_XQ);
    /* connect to Out[2] */
    p.addWire(Wires.Out[2]);
    /* connect to LongHoriz[0] */
    p.addWire(Wires.LongHoriz[0]);
    /* at 10,22 tap the LongHoriz[0] */
    p.addstart(10,22,Wires.LongHoriz[0]);
    /* connect it to HexEast[0] */
    p.addWire(Wires.HexEast[0]);
    /* connect it to SingleEast[0] */
    p.addWire(Wires.SingleEast[22]);
    /* connect it to S0F1 */
```

```
    p.addWire (Wires.S0F1);
    /* route(Path path) */
    jroute.route(p);
/* Define a Path - way 2 */
    /* define the path as an int array */
    int[ ] path = { Wires.S0_XQ, Wires.Out[0],
                    Wires.DirectEast[0], Wires.S0F2 }
    /* create a Path object */
    Path p = new Path(14,15,path);
    /* route(Path path) */
    jroute.route(p);
/* Single connection */
    /*    turn on the connection from SingleNorth[0] to
          SingleSouth[0] in clb (14,22) */
    /* route(int row, int col, int from, int to) */
    jroute.route(14, 22, Wires.SingleNorth[0], Wires.SingleSouth[0]);
/* unroute - forward */
    /*    turn off all connections that are sourced by S0_XQ in
          (11,22) */
    Pin src = new Pin(11,22,Wires.S0_XQ);
    /* unroute(Pin source) */
    jroute.unroute(src);
/* unroute - reverse */
    /*    turn off all connections on the branch that leads to
          S0F1 in (11,22) */
    Pin sink = new Pin(11,22,Wires.S0F1);
    /* reverseUnroute(Pin sink) */
    jroute.reverseUnroute(sink);
/* Check if a wire is on */
    /* check if SingleWest[0] in clb (12,49) is on */
    /* isOn(int row, int col, int wire ) */
    boolean on = jroute.isOn(12, 49, Wires.SingleWest[0]);
```

The present invention is believed to be applicable to a variety of processes for implementing circuit designs and has been found to be particularly applicable and beneficial in PLDS. While the present invention is not so limited, an appreciation of the present invention has been provided by way of specific examples involving PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An application programming interface for configuring routing resources of a programmable logic device, comprising:

a first function configured and arranged to automatically generate configuration bits for configuration of routing resources that connect a source to a sink responsive to input data specifying the source and sink;

a second function configured and arranged to automatically generate configuration bits for configuration of routing resources that connect a source to a plurality of sinks responsive to input data specifying the source and the plurality of sinks.

2. The interface of claim 1, further comprising a third function configured and arranged to generate configuration bits for configuration of routing resources that connect a source to a sink consistent with a set of types of resources responsive to input data specifying the types of resources.

3. The interface of claim 2, wherein the set of types of resources is an ordered set.

4. The interface of claim 3, further comprising a fourth function configured and arranged to add a resource type to the ordered set responsive to input data specifying the resource type.

5. The interface of claim 1, wherein the first function is further configured and arranged to generate a plurality of ordered sets of resource types and determine whether routing resources can be configured consistent with any of the ordered sets of resource types.

6. The interface of claim 1, further comprising a third function configured and arranged to generate configuration bits for configuration of routing resources that connect a plurality of sources to a plurality of sinks responsive to input data specifying the sources and sinks.

7. The interface of claim 1, further comprising a third function configured and arranged to generate and output an ordered set of resource types beginning at a source and terminating at a sink responsive to input data specifying the source and sink.

8. The interface of claim 1, further comprising a third function configured and arranged to generate configuration bits that release routing resources that connect a source and a sink responsive to input data specifying the source.

9. The interface of claim 8, further comprising a fourth function configured and arranged to generate configuration bits that release routing resources beginning at a sink and proceeding toward the source responsive to input data specifying the sink, wherein releasing the routing resources stops where a routing resource is one of two or more routing resources driven at a connection point.

10. The interface of claim 1, further comprising a third function configured and arranged to generate configuration bits for configuration of routing resources that connect a source to a sink responsive to input data specifying the source, sink, and specific routing resources comprising a path.

11. The interface of claim 10, further comprising a fourth function configured and arranged to add a specific routing resource to the path responsive to input data specifying the specific routing resource.

12. A computer-implemented method for configuration of routing resources of a programmable logic device, comprising:
providing a program interface having as input parameters a source and a sink corresponding to an output port and an input port of configurable elements of a programmable logic device, respectively; and
generating configuration bits for configuration of routing resources for connection of the source and sink responsive to programming interface calls.

13. The method of claim 12, further comprising generating configuration bits that configure routing resources that connect a source to a sink consistent with a set of types of resources responsive to input data specifying the types of resources.

14. The method of claim 13, wherein the set of types of resources is an ordered set.

15. The method of claim 14, further comprising:
providing a program interface for constructing an ordered set of types of resources; and
adding a resource type to the ordered set responsive to input data specifying the resource type.

16. The method of claim 12, further comprising generating a plurality of ordered sets of resource types and determining whether routing resources can be configured consistent with any of the ordered sets of resource types.

17. The method of claim 12, further comprising generating configuration bits for configuration of routing resources that connect a plurality of sources to a plurality of sinks responsive to input data specifying the sources and sinks.

18. The method of claim 12, further comprising:
providing a program interface for finding an ordered set of resource types; and
generating and outputting one or more ordered sets of resource types beginning at a source and terminating at a sink responsive to input data specifying the source and sink.

19. The method of claim 12, further comprising:
providing a program interface to disconnect a source and a sink; and
generating configuration bits that release routing resources that connect a source and a sink responsive to input data specifying the source.

20. The method of claim 19, further comprising generating configuration bits that release routing resources beginning at a sink and proceeding toward the source responsive to input data specifying the sink, wherein releasing the routing resources stops where a routing resource is one of two or more routing resources driven at a connection point.

21. The method of claim 12, further comprising generating configuration bits for configuration of routing resources to connect a source to a sink responsive to input data specifying the source, sink, and specific routing resources comprising a path between the source and the sink.

22. The method of claim 21, further comprising:
providing a program interface for constructing a path; and
adding a specific routing resource to the path responsive to input data specifying the specific routing resource.

23. An apparatus for configuring routing resources of a programmable logic device, comprising:
means for automatically generating configuration bits for configuration of routing resources that connect a source to a sink responsive to input data specifying the source and sink; and
means for automatically generating configuration bits for configuration of routing resources that connect a source to a plurality of sinks responsive to input data specifying the source and plurality of sinks.

* * * * *